United States Patent
Matsui et al.

(10) Patent No.: US 6,998,673 B2
(45) Date of Patent: Feb. 14, 2006

(54) SEMICONDUCTOR DEVICE AND METHOD OF MANUFACTURING THE SAME

(75) Inventors: Michiharu Matsui, Fujisawa (JP); Seiichi Mori, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/099,503

(22) Filed: Apr. 6, 2005

(65) Prior Publication Data

US 2005/0167759 A1   Aug. 4, 2005

Related U.S. Application Data

(62) Division of application No. 10/691,572, filed on Oct. 24, 2003, now Pat. No. 6,902,976, which is a division of application No. 10/233,557, filed on Sep. 4, 2002, now Pat. No. 6,661,052.

(30) Foreign Application Priority Data

Sep. 4, 2001   (JP)   ............................... 2001-267676

(51) Int. Cl.
  *H01L 29/788*   (2006.01)

(52) U.S. Cl. ...................................... 257/316; 257/510

(58) Field of Classification Search ................ 257/316, 257/510, 392, 500

See application file for complete search history.

(56) References Cited

U.S. PATENT DOCUMENTS

| | | | |
|---|---|---|---|
| 6,661,052 B2 | 12/2003 | Matsui et al. | |
| 6,902,976 B2 * | 6/2005 | Matsui et al. | ............... 438/257 |
| 2002/0017692 A1 | 2/2002 | Shimizu et al. | |
| 2002/0036317 A1 | 3/2002 | Matsui et al. | |

FOREIGN PATENT DOCUMENTS

| | | |
|---|---|---|
| JP | 2000-245029 | 9/2000 |
| JP | 2000-291910 | 10/2000 |

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A semiconductor device is disclosed, which comprises trench type device isolation regions formed in a semiconductor substrate, semiconductor active regions electrically isolated by the isolation regions, a first electrode layer formed to self-align to the isolation regions, and a second electrode layer formed over the first electrode layer with an insulating film interposed therebetween, the top of each of the isolation regions being located, in an area where the second electrode layer is present, at a first level below the top of the first electrode layer and above the surface of the active regions and, in an area where the second electrode layer is not present, at a second level below the first level, and the surface of the active regions being at substantially the same level in the area where the second electrode layer is present and in the area where the second electrode layer is not present.

10 Claims, 24 Drawing Sheets

Memory cell area

Peripheral circuit region

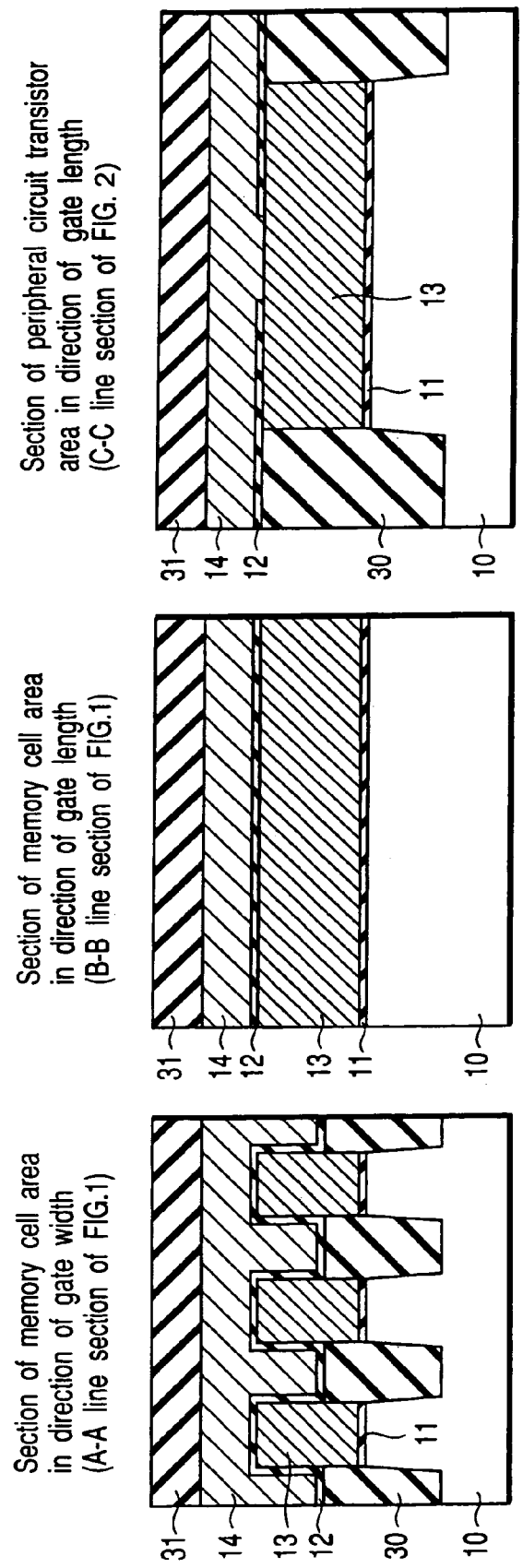

Section of memory cell area in direction of gate width (D-D line section of FIG.1)

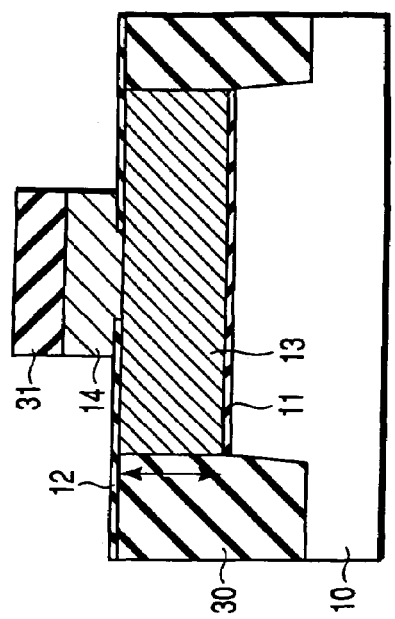
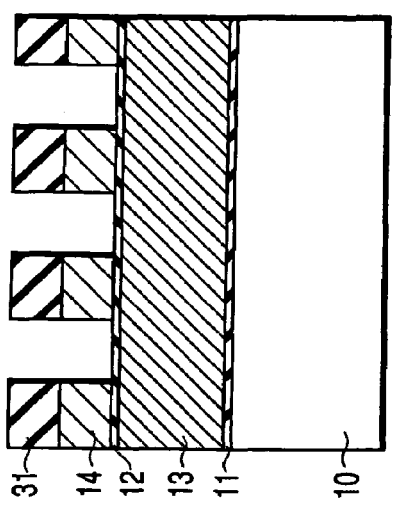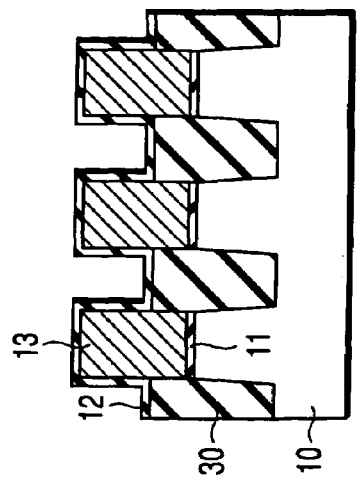
F I G. 5C
F I G. 5B
F I G. 5A

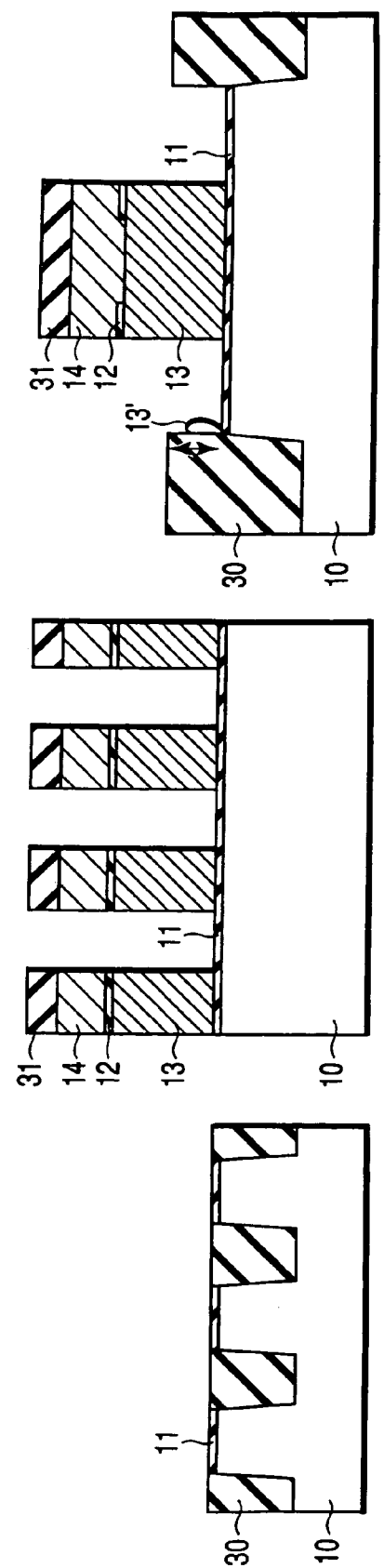

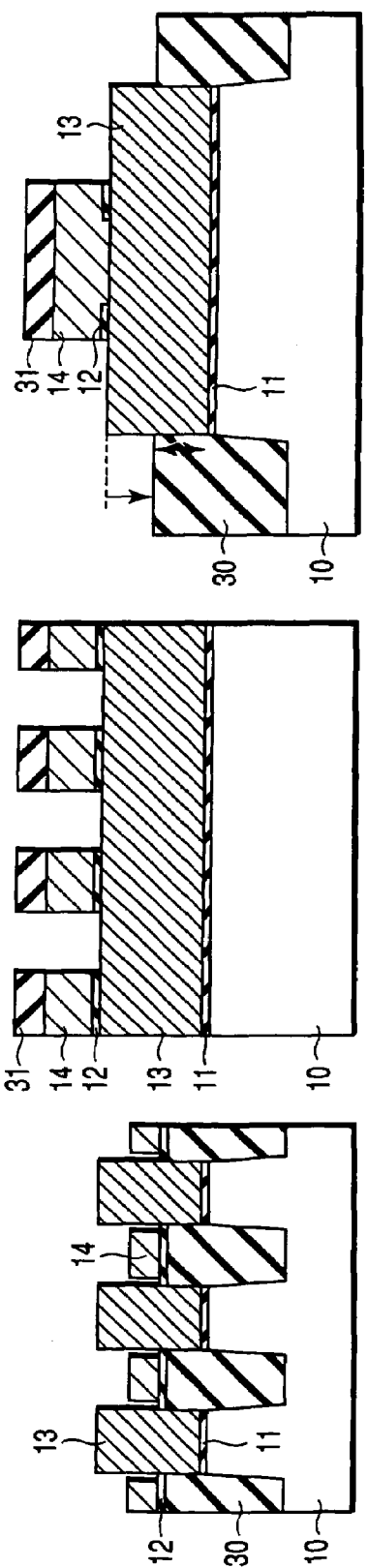

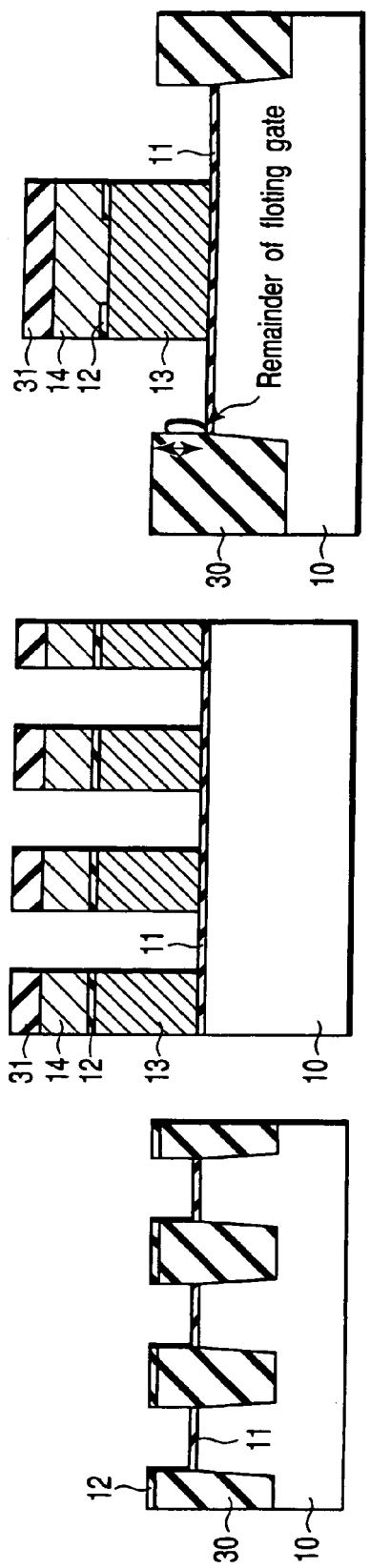

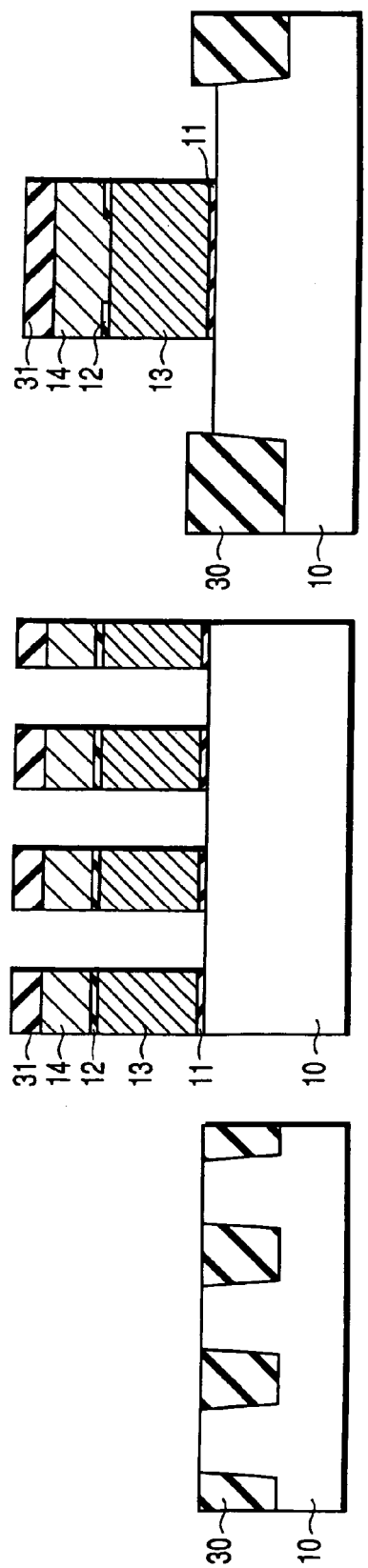

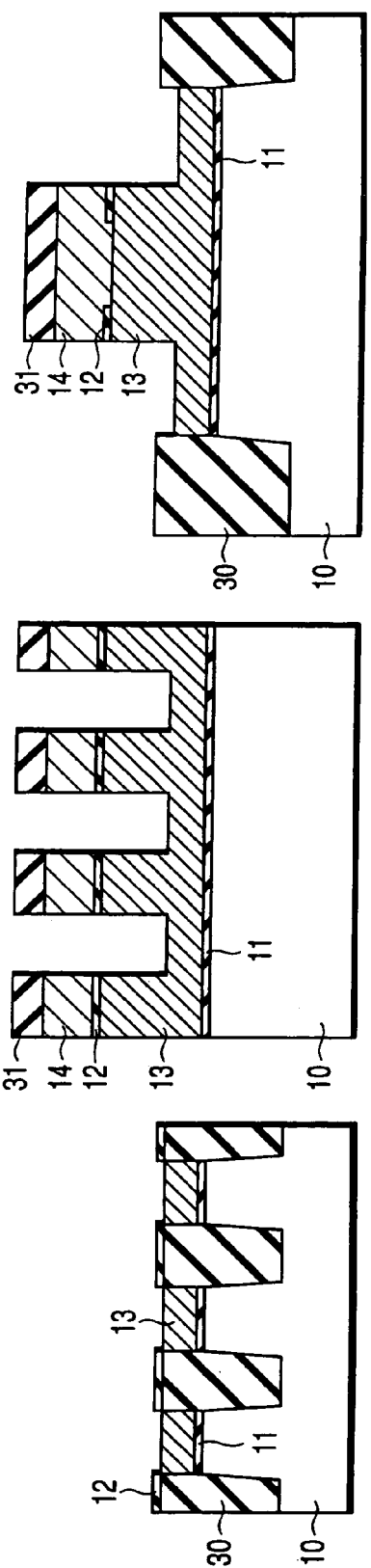

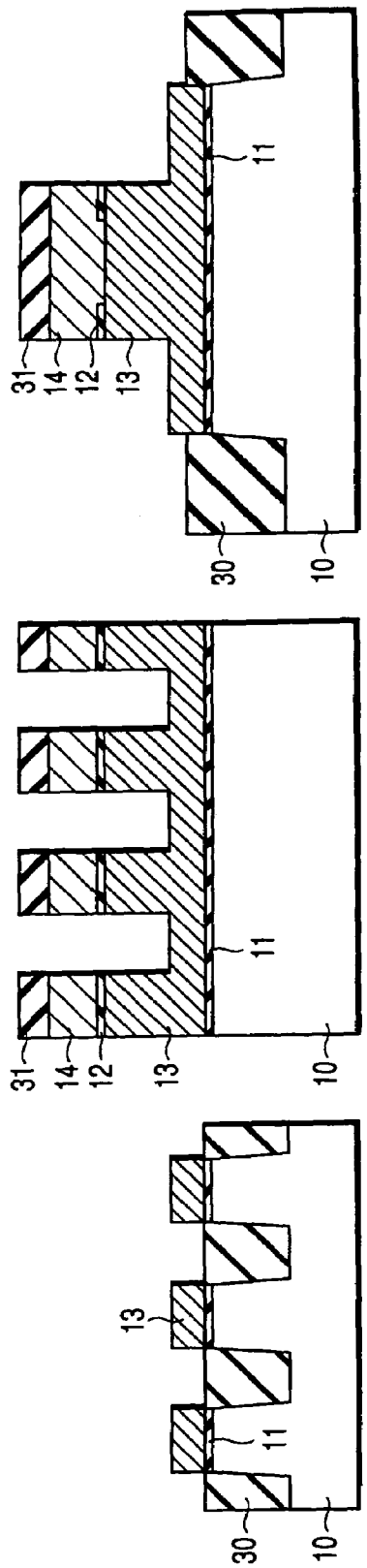

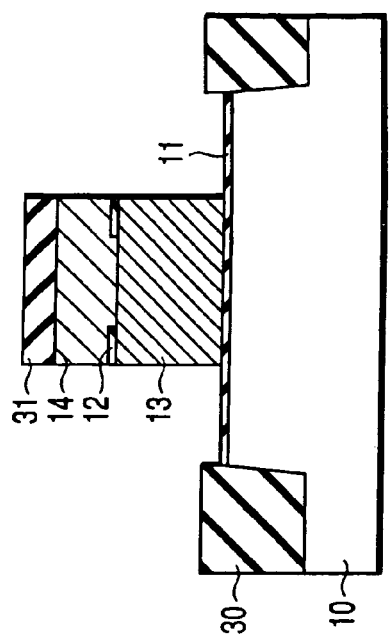
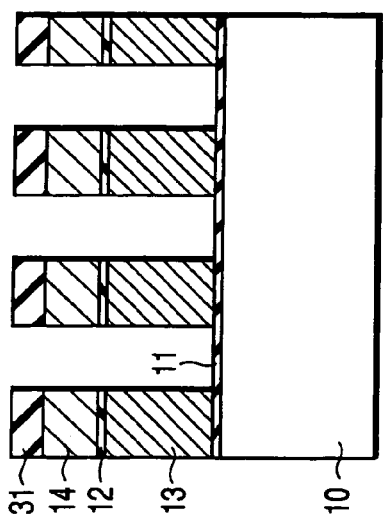
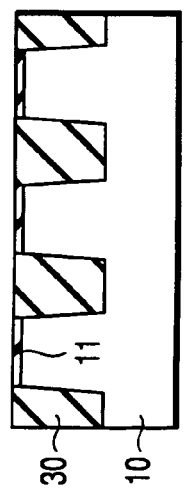
FIG. 14A
FIG. 14B
FIG. 14C

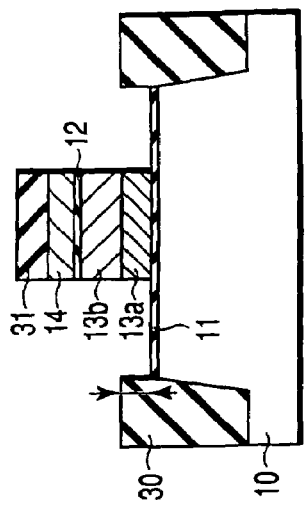
F I G. 22C
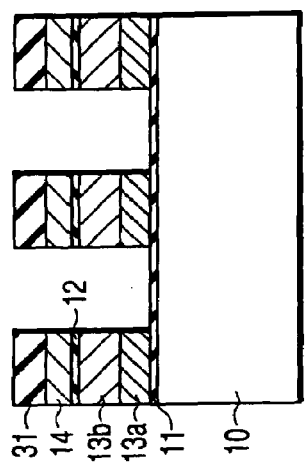
F I G. 22B
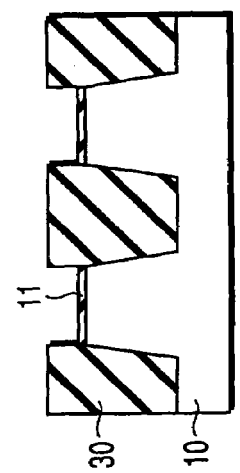
F I G. 22A

SEMICONDUCTOR DEVICE AND METHOD OF MANUFACTURING THE SAME

CROSS-REFERENCE TO RELATED APPLICATIONS

This application is a divisional of and claims the benefit of priority under 35 USC §120 from U.S. application Ser. No. 10/691,572, filed Oct. 24, 2003, which is a division of U.S. Pat. No. 6,661,052, which issued on Dec. 9, 2003, and is based upon and claims the benefit of priority under 35 USC §119 from Japanese Patent Application No. 2001-267676, filed Sep. 4, 2001, the entire contents of which are incorporated herein by reference.

BACKGROUND OF THE INVENTION

1. Field of the Invention

The present invention relates to a semiconductor device having trench type device isolation regions and a method of manufacturing the semiconductor device. More specifically, the present invention relates to the structure of trench type device isolation regions of a semiconductor device having semiconductor active regions self-aligned to electrode layers and a method of formation thereof. The present invention is applied, for example, to a nonvolatile memory having a two-layer (stacked) gate structure in which the floating gate is self-aligned to a device isolation region.

2. Description of the Related Art

As a nonvolatile semiconductor storage device that is electrically re-programmable which is adapted for high packing density and large capacity, a flash memory is well known. The flash memory has an array of memory cells of the MOS transistor structure in which two gate electrode layers are stacked; a charge storage layer (floating gate electrode) and a control gate electrode layer.

In the memory cell array of a NAND type flash memory, a plurality of memory cells are series-connected with the source of one cell used as the drain of the adjacent one, thereby forming a NAND configuration with a series of memory cells. Select transistors are placed at both ends of each NAND series. The source or drain of one select transistor is connected to a bit line through a bit line contact, while the source or drain of the other select transistor is connected to a source line through a source line contact.

In manufacturing such a NAND type flash memory, a gate preformation process may be used. This process involves forming a gate oxide over the entire surface of a silicon substrate (including the memory cell area and the peripheral circuit area), depositing a polysilicon film which will serve as floating gates of memory cells (cell transistors), patterning the deposited polysilicon film to form floating gate electrodes, and forming an insulating film for trench type device isolation regions to self-align to the floating gate electrodes.

At least part of a number of peripheral transistors that make up peripheral circuits of memory cells (for example, the select transistors) may be formed into the stacked gate structure which, like the memory cells, comprises a charge storage layer and a control gate layer. In this case, the gates of transistors of the same gate structure in the memory cell area and the peripheral circuit area can be processed under the same etching conditions, allowing the processing steps to be reduced and the processing processes to be made common to each other.

FIGS. 18A, 18B and 18C are sectional views, at a stage of manufacture, of a conventional NAND type flash memory. More specifically, FIGS. 18A and 18B are sectional views of the stacked gate structure of memory cells in the direction of gate width W (in the direction of word lines) and in the direction of gate length L, respectively, and FIG. 18C is a sectional view of a peripheral transistor in the direction of gate length L. FIGS. 19A, 19B and 19C through FIGS. 22A, 22B and 22C are sectional views, at subsequent stages of manufacture, of the same portions of the conventional NAND type flash memory as in FIGS. 18A, 18B and 18C, respectively.

First, as shown in FIGS. 18A, 18B and 18C, a first insulating film 11 is formed over the entire surface of a semiconductor substrate (Si substrate) 10. A first layer 13a (lower layer) of polysilicon for floating gate electrode is then formed on the first insulating film 11.

Next, device isolation trenches are formed to self-align to the floating gate electrodes 13a and an insulating film is deposited to fill the device isolation trenches. After that, the deposited insulating film is smoothed until the surface of the first floating gate electrode layer 13a is exposed, thereby forming device isolation regions 30. In this case, the top of the device isolation regions 30 is at a level above the Si substrate surface. That is, a step exists between the top of the device isolation region 30 and the Si substrate surface.

Next, a floating gate electrode layer 13b as a second layer consisting of polysilicon is formed over the entire surface and then patterned by means of lithographic and etching techniques. In this case, the second floating gate electrode layer 13b is stacked on the first floating gate electrode layer 13a and patterned to overlap the device isolation regions 30.

Next, a second insulating film 12 is formed over the entire surface of the substrate. A control gate electrode layer 14 is formed on the second insulating film 12 and then formed on top with a gate masking material layer 31.

Next, as shown in FIGS. 19A, 19B and 19C, the gate masking material layer 31 is patterned to form a gate masking pattern 31.

Next, as shown in FIGS. 20A, 20B and 20C, the control gate electrode layer 14 is etched using the gate masking pattern 31 as a mask.

Next, as shown in FIGS. 21A, 21B and 21C, the second insulating film 12 is etched using the gate masking pattern 31 as a mask.

Next, as shown in FIGS. 22A, 22B and 22C, the second floating gate electrode layer 13b and the first floating gate electrode layer 13a are etched using the gate masking pattern 31 as a mask. Thereby, the stacked gate structure is obtained in which the floating gate electrode 13 in the form of two layers and the control gate electrode 14 are stacked. In this stage, a two-layer gate structure which is the same as that shown in FIG. 18A is left below the word lines in the direction of gate width W in the memory cell area. Also, in this state, the top of the device isolation regions 30 is above the Si substrate surface level. That is, a step is formed between the top of the device isolation region 30 and the Si substrate surface.

After that, the stacked gates are covered with a capping material and then an interlayer insulating film is formed over the entire substrate of the substrate. Next, contact windows are formed in the interlayer insulating film and an interconnect layer is then formed.

In forming the interlayer insulating film, a BPSG film in which impurities, such as boron or phosphorus, are mixed into a silicon dioxide film to increase melting performance is deposited and then planarized by means of CMP. After that, contact windows are formed in the interlayer insulating film by dry etching. In this case, unless the etch selectivity between the capping material and the interlayer insulating film is high, the capping material on the gates will also be etched to reduce the thickness or removed thoroughly to expose the gates. Then, in filling the contact material into the contact windows, failures may occur in which the gates and the contact material are short-circuited. Thus, as the capping material use is made of a silicon nitride-based film which has relatively high etch selectivity to the silicon dioxide-based interlayer insulating film.

In the structure of FIGS. 22A–22C realized by the gate preformation process, the device isolation insulating film 30 is formed to self-align to the sidewall of the floating gate electrodes 13a and its top is above the Si substrate surface level. That is, the active regions in the Si substrate are surrounded by the device isolation insulating film 30 whose top is above the surface level of the active regions.

However, it has become clear that such a structure as described above causes various problems as device dimensions are scaled down.

In many cases, as a contact window etching stopper a silicon nitride film is deposited on the substrate surface so as to prevent contact windows from being formed too deep in those portions of the interlayer insulating film formed over the entire surface after the formation of stacked gates which are located over the source/drain regions of memory cells. That is, the etching of the interlayer insulating film stops at this silicon nitride film. The silicon nitride film is then etched in a short time under silicon nitride etching conditions.

However, as the source/drain regions of memory cells are scaled down, it becomes very difficult to form openings in the silicon nitride film formed on the surface of source/drain active regions which are surrounded by the device isolation regions to form trenches, since the silicon nitride film is buried on the surface of source/drain active regions. Even though it is not so difficult, a contact barrier film (SiN) is formed on sidewalls of the device isolation regions with the result that the thickness of the silicon nitride film on sidewalls increases, resulting in failure to remove the sidewall silicon nitride film at the time of formation of contact windows (the silicon nitride film is left as sidewall spacers). Thus, the contact area is reduced and the contact resistance is increased.

As a measure for this problem, in Japanese Patent Application No. 2000-245029 assigned to the same assignee as this application, a proposal has been made for a structure which allows the device isolation insulating film to be reduced in step height by etching the device isolation insulating film and the gate insulating film on the substrate surface after the formation of the floating gate electrodes.

According to such a structure, it becomes possible to minimize the problem that the contact barrier film is formed on the sidewall of the device isolation insulating film when the contact windows are formed on the source/drain regions of memory cells by means of RIE or the silicon nitride film is buried on the top of the source/drain active regions.

However, even with the structure in which the step height of the device isolation insulating film is reduced by etching the device isolation insulating film and the gate insulating film on the substrate surface after the formation of the floating gate electrodes, it has become clear that a problem still remains.

First, in etching the device isolation insulating film by RIE after the formation of the floating gate electrode, the gate insulating film on the source/drain regions would also be etched away, causing the Si substrate to undergo etching.

Normally, use is made of etching conditions in which the etch rate of the device isolation insulating film (silicon oxide film) is high, whereas the etch rate of the Si substrate is low; nevertheless, the Si substrate would be subjected to etching to some extent and the substrate surface level would be lowered.

As a result, the depth of the source/drain regions equivalently increases by the amount that the substrate surface level is lowered, leading to the short-channel effect and performance degradation of the memory cells and transistors. This is important in view of a requirement of making the depth of the source/drain regions of memory cells and transistors from the gate oxide surface as small as possible as device dimensions are scaled down.

Furthermore, when the Si substrate is subjected to etching under etching conditions for the device isolation insulating film (silicon oxide film), an element, such as carbon, is driven as impurities into the Si substrate or the Si substrate is damaged by etching plasma. This will result in problems of degradation in the quality of a post-oxide film to be formed later, the occurrence of junction leakage current in source/drain diffused regions, and the occurrence of defective crystal.

When the active regions (device regions) in the Si substrate are surrounded by higher device isolation insulating film, it becomes impossible to etch away the gate material layer on the sidewall of the device isolation insulating film. That is, the gate material is left.

In this case, as the ratio between the opening of the portion surrounded by the device isolation insulating film and the depth to the device region (active region aspect ratio) increases, it becomes more difficult for an etching gas to flow into that portion and hence the gate material becomes more easy to be left.

The remaining gate material would cause gate electrodes to be short-circuited. In many cases, etching under conditions that the gate oxide film is small in thickness and a reduction in the thickness of the gate oxide film should be minimized during etching of the gate layer makes it easier for the gate material to be left.

To scale down the dimensions of memory cells, a structure of memory cells and peripheral transistors has been proposed in Japanese Patent Application No. 2000-291910 assigned to the same assignee as this application. According to this structure, a floating gate electrode of one layer structure (first electrode layer) is formed and a device isolation region is formed to self-align to the first electrode layer.

FIG. 23 shows, in sectional view, the memory cell area and the peripheral circuit area of a semiconductor device disclosed in Japanese Patent Application No. 2000-291910.

The memory cell area comprises a semiconductor substrate 11, device isolation regions 15 that isolate device regions 10 in the substrate, a first electrode layer (floating gate electrodes) 13 formed over the device regions 10 with a first insulating film 12 interposed therebetween, a second insulating film 16 formed on the first electrode layer 13 and the device isolation regions 15, and a second electrode layer (control gate electrode) 18 formed on the second insulating film 16. The top of the device isolation regions 15 is below the surface level of the first electrode layer 13.

The method of manufacture of the semiconductor device of FIG. 23 will be described next.

First, the first insulating film 51 is formed over the surface of the substrate 50. The floating gate electrodes 53 are formed on the first insulating film 51. The device isolation trenches are formed in the substrate to self-align to the floating gate electrodes 53. An insulating film is deposited over the entire surface of the substrate to fill the device isolation trenches. The insulating film is planarized until the top of the floating gate electrodes 53 is exposed, thereby forming the device isolation regions 60.

Next, the upper portion of each device isolation region is removed until the top of the device isolation region 30 in the memory cell area is located below the top of the floating gate electrodes 53. After that, the second insulating film (a composite insulating film including a silicon nitride film is desired; for example, an ONO film) 52 is formed over the entire surface of the substrate. A portion of the second insulating film 52 which is located over the device region in the peripheral circuit area is removed by means of lithographic and etching techniques. As a result, a portion of the surface of the floating gate electrode 53 is exposed to form an opening 61. Next, the control gate electrode layer 54 is formed over the entire surface of the substrate. The control gate electrode layer 54 and the second insulating film 52 are patterned. The control gate electrode layer 54 is lower in resistivity than the floating gate electrode 53 and preferably made of a refractory metal or refractory metal silicide.

Next, a third insulating film 62 is formed over the entire surface of the substrate. Contact holes 63 are formed in portions of the third insulating film 62 which are located above the device isolation regions 60 and interconnect lines 64 are then formed.

As a result, in the memory cell area, the interconnect line 64 and the second electrode layer 54 are connected together and, in the peripheral circuit area, the interconnect line 64 and the floating gate electrode 53 are connected through the second electrode layer 54.

Even in the structure which is realized by the gate preformation process, the device isolation insulating film 60 is formed to self-align to the floating gate electrodes 53 and the top thereof is located at a level above the Si substrate surface. That is, each active region in the Si substrate is surrounded by the higher device isolation insulating film 60.

In the above-described structure, the lower gate layer (corresponding to the floating gate layer in the memory cell area) of the peripheral transistor is in contact with the sidewall of the device isolation insulating film 60 which is thick in comparison with that in the conventional structure. In etching the lower gate layer, a portion of the gate material is left unetched on the sidewall of the device isolation insulating film as in the memory cell area, causing gate electrodes to be short-circuited.

In optimizing the etching condition at a certain active region aspect ratio, the optimum condition may be found. However, in the peripheral circuit area, unlike the memory cell area, it is very difficult to set the optimum condition because various active region aspect ratios are involved. In many cases, the peripheral transistor has a low-voltage-operated logic circuit connected to it. Since the gate insulating film of the peripheral transistor is normally small in thickness, the gate material is more prone to be left unetched. In particular, problems are involved in processing the stacked gates of memory cells and peripheral transistors at the same time.

As described above, the conventional semiconductor devices have a problem of gate electrodes being short-circuited because a portion of the gate material is left unetched on the sidewall of the device isolation insulating film whose top is above the surface level of active regions in the Si substrate.

BRIEF SUMMARY OF THE INVENTION

According to an aspect of the present invention, there is provided a semiconductor device comprising: a plurality of trench type device isolation regions formed in a semiconductor substrate; a plurality of semiconductor active regions electrically isolated by the device isolation regions; a first electrode layer formed to self-align to the semiconductor active regions; and a second electrode layer formed over the first electrode layer with an insulating film interposed therebetween, the top of each of the device isolation regions being located, in an area where the second electrode layer is present, at a first level below the top of the first electrode layer and above the surface of the semiconductor active regions and, in an area where the second electrode layer is not present, at a second level below the first level, and the surface of the semiconductor active regions being at substantially the same level in the area where the second electrode layer is present and in the area where the second electrode layer is not present.

BRIEF DESCRIPTION OF THE SEVERAL VIEWS OF THE DRAWING

FIG. 3A is a sectional view of the memory cell area taken substantially along line A—A of FIG. 1 in the direction of gate width at a stage of manufacture of the flash memory;

FIG. 3B is a sectional view taken substantially along line B—B of FIG. 1 in the direction of gate length at the same stage as in FIG. 3A;

FIG. 3C is a sectional view of the peripheral circuit area taken substantially along line C—C of FIG. 2 in the direction of gate length at the same stage as in FIG. 3A;

FIGS. 5A, 5B and 5C are sectional views of the flash memory which correspond to FIGS. 3A, 3B and 3C, respectively, after the step of etching the control gates subsequent to the stage of FIGS. 4A–4C;

FIGS. 7A, 7B and 7C are sectional views of the flash memory which correspond to FIGS. 3A, 3B and 3C, respectively, after the step of etching the floating gates subsequent to the stage of FIGS. 6A–6C;

FIGS. 9A, 9B and 9C are sectional views of the flash memory after the stage of FIGS. 8A–8C;

FIGS. 10A, 10B and 10C are sectional views of the flash memory after the stage of FIGS. 9A–9C;

FIGS. 11A, 11B and 11C are sectional views of the flash memory after the stage of FIGS. 10A–10C;

FIGS. 12A, 12B and 12C are sectional views of the flash memory after the stage of FIGS. 9A–9C in accordance with still another manufacturing method;

FIGS. 13A, 13B and 13C are sectional views of the flash memory after the stage of FIGS. 12A–12C;

FIGS. 14A, 14B and 14C are sectional views of the flash memory after the stage of FIGS. 13A–13C;

FIGS. 22A, 22B and 22C are sectional views of the conventional flash memory after the stage of FIGS. 21A–21C;

DETAILED DESCRIPTION OF THE INVENTION

The preferred embodiments of the present invention will be described hereinafter in detail with reference to the accompanying drawings.

[First Embodiment]

Figure 1:
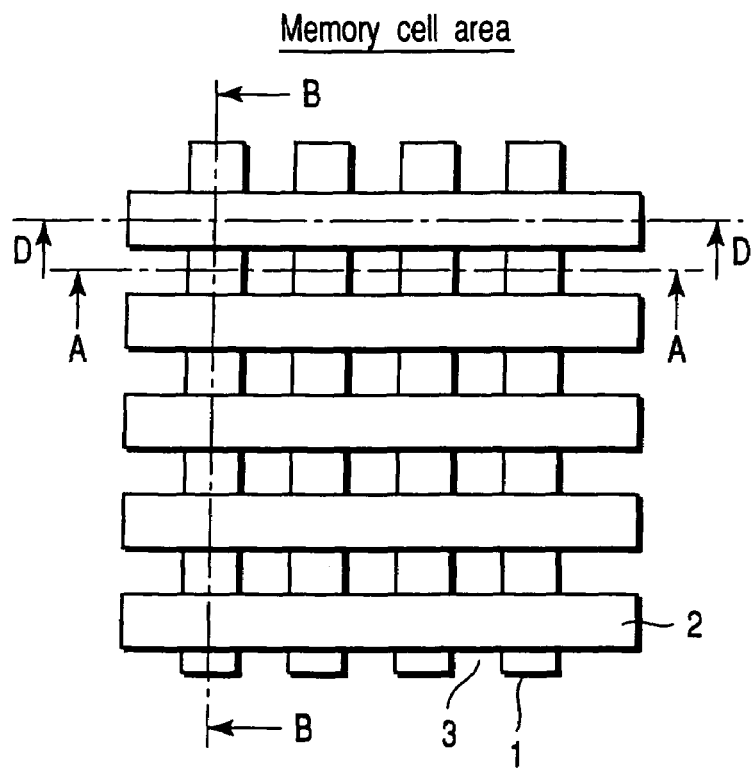
FIG. 1 is a plan view of a portion of the memory cell area of a NAND type of flash memory according to a first embodiment of the present invention.
Figure 2:
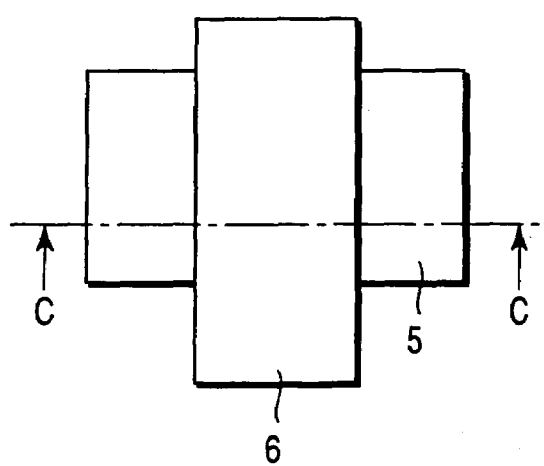
FIG. 2 is a plan view of a portion of a transistor in the peripheral circuit area of the NAND type of flash memory according to the first embodiment of the present invention.

FIG. 1 is a plan view of a portion of the memory cell area of a NAND type of flash memory according to a first embodiment of the present invention, and FIG. 2 is a plan view of a transistor in the peripheral circuit area of the flash memory.

In the memory cell array area shown in FIG. 1, a plurality of NAND series are formed each of which comprises a series of memory cells which are connected in series with the source of one memory cell used as the drain of the adjacent memory cell. In each NAND series, 1 denotes the source or drain regions of memory cells, 2 denotes gate lines (word lines) each including the upper control gate of a two-layer gate formed over the channel region of each memory cell with a gate insulating film (not shown) interposed therebetween, and 3 denotes device isolation regions each of which is adapted to isolate device regions (source region, drain region, and channel region) in adjacent NAND series from each other.

In the peripheral circuit area shown in FIG. 2, 5 denotes the source or drain region of a peripheral transistor and 6 denotes a gate line including the upper gate of a two-layer gate formed over the channel region of the peripheral transistor with a gate insulating film (not shown) interposed therebetween. This peripheral transistor, while having a two-layer gate, functions as a normal MOS transistor by the upper and lower gates being electrically connected together.

When the peripheral transistor is one of select transistors connected to both ends of a NAND series, one of the select transistors shares one of its drain and source regions with the memory cell at the corresponding end of the NAND series and has the other of its drain and source regions connected to a bit line (not shown) via a bit line contact. The other of the select transistors shares one of its drain and source regions with the memory cell at the other end of the NAND series and has the other of its drain and source regions connected to a source line (not shown) via a source line contact.

As can be seen from FIG. 1, the gate line 2 extends in a direction that intersects the cell column. Thus, the device isolation region 3 has portions each formed with a gate and portions with no gate.

Figure 3D:
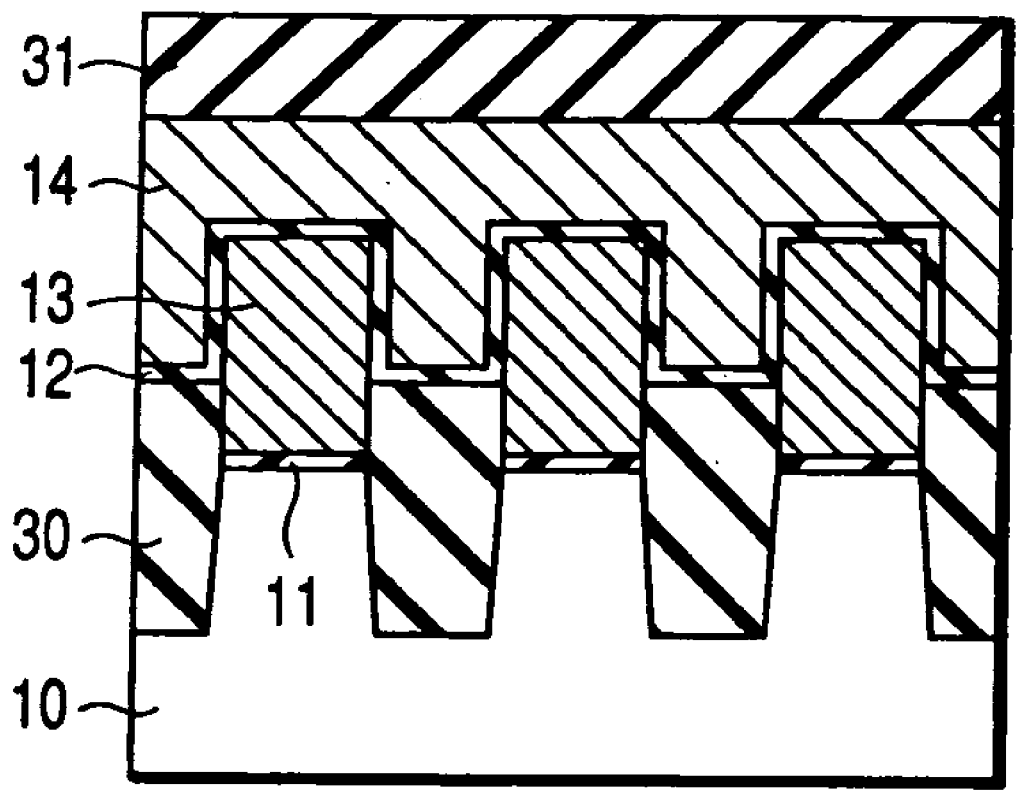
FIG. 3D is a sectional view of the memory cell area taken substantially along line D—D of FIG. 1 in the direction of gate width at a stage of manufacture of the flash memory.

FIG. 3A is a sectional view, taken substantially along line A—A of FIG. 1 in the direction of gate width (word line direction), of the memory cell area of the flash memory according to the first embodiment of the present invention at a stage of manufacture thereof. FIG. 3B is a sectional view, taken substantially along line B—B of FIG. 1 in the direction of gate length, of the memory cell area at the same stage as in FIG. 3A. FIG. 3C is a sectional view of the peripheral circuit area taken substantially along line C—C of FIG. 2 in the direction of gate length at the same stage as in FIG. 3A. FIG. 3D is a sectional view, taken substantially along line D—D of FIG. 1 in the direction of gate width (word line direction), of the memory cell area at the same stage as in FIG. 3A. FIGS. 4A to 4C through FIGS. 7A to 7C are sectional views corresponding to FIGS. 3A to 3C at various stages of manufacture. FIGS. 3A–3D through FIGS. 7A–7C illustrate the sectional structures of the flash memory at sequential stages of manufacture thereof in the case where each of transistors in the memory cell and peripheral circuit areas shown in FIGS. 1 and 2 consists of a transistor having a floating gate of one-layer structure.

First, as shown in FIGS. 3A–3D, an insulating film 11 is formed over the entire surface of a semiconductor substrate (Si substrate) 10 and a first floating gate layer consisting of polysilicon is then formed over the first insulating film 11.

Next, the floating gate layer is patterned by means of lithographic and etching techniques to form floating gate electrodes 13. Subsequently, device isolation trenches are formed to self-align to the floating gate electrodes 13 and an insulating film is deposited to a sufficient thickness to fill up the trenches. After that, the insulating film is planarized until the top of each of the floating gate electrodes 13 is exposed, thereby forming device isolation regions 30. At this point, the top of each of the device isolation regions 30 is above the Si substrate surface level.

Next, the upper portion of each of the device isolation regions 30 in the memory cell area is removed so that its top is located at a level below the top of the floating gate electrodes 13. After that, a second insulating film 12 (preferably made of a composite insulating film including silicon nitride; for example, an ONO film) is formed over the entire surface of the substrate. A portion of the second insulating film 12 over each of device regions in the peripheral circuit area is removed using lithographic and etching techniques. As a result, an opening is formed in the second insulating film 12 to expose a portion of the surface of each of the floating gate electrodes 13. Next, a control gate electrode layer (which is lower in resistivity than the floating gate electrode 13 and preferably made of a refractory metal or refractory metal silicide) 14 and a gate masking layer 31 are formed in sequence over the entire surface of the substrate.

Figure 4C:
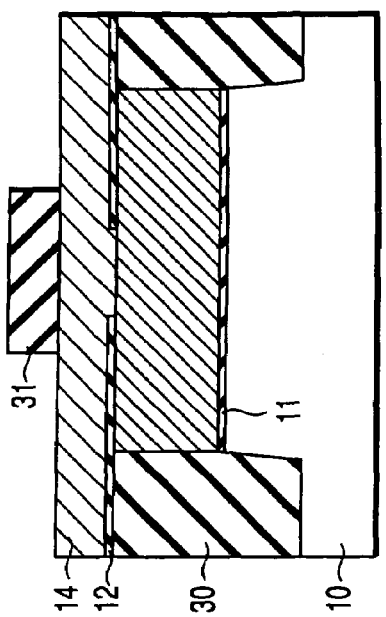
FIGS. 4A, 4B and 4C are sectional views of the flash memory which correspond to FIGS. 3A, 3B and 3C, respectively, after the step of etching the gate mask material subsequent to the stage of FIGS. 3A–3D.
Figure 4B:
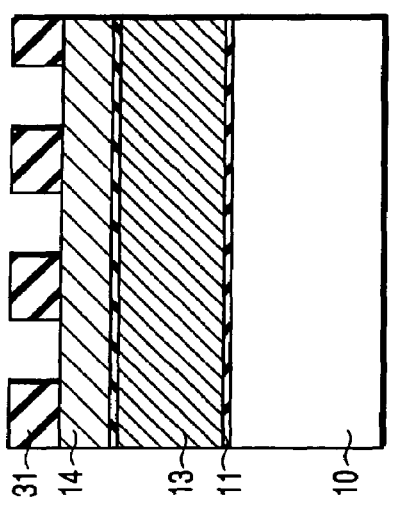
Figure 4A:
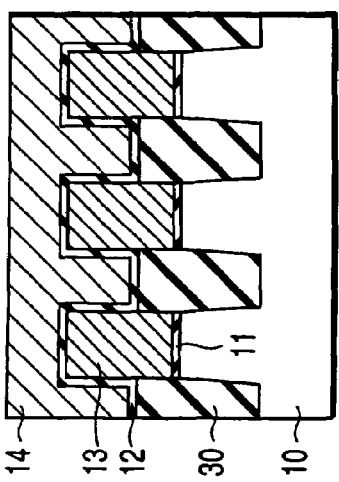

Next, a resist pattern (not shown) is formed using lithographic techniques and then the gate masking material layer 31 is patterned by means of RIE (Reactive Ion Etching) using the resist pattern as a mask to form a gate masking pattern 31 as shown in FIGS. 4A–4C.

Next, as shown in FIGS. 5A–5C, the control gate layer 14 is patterned by means of RIE using the gate making pattern 31 as a mask to form control gates.

Figure 6C:
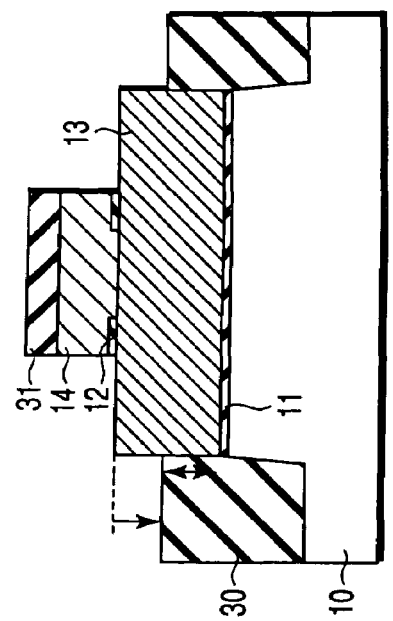
FIGS. 6A, 6B and 6C are sectional views of the flash memory which correspond to FIGS. 3A, 3B and 3C, respectively, after the step of etching the second insulating film and the device isolation insulating film subsequent to the stage of FIGS. 5A–5C.
Figure 6B:
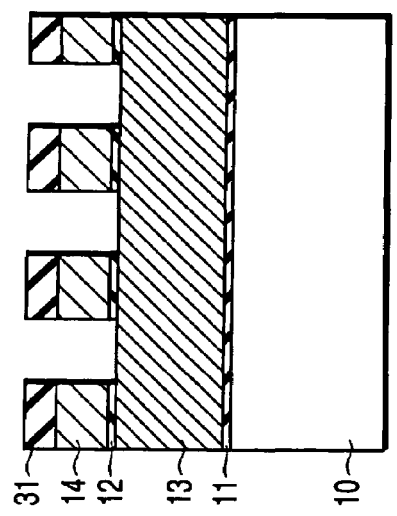
Figure 6A:
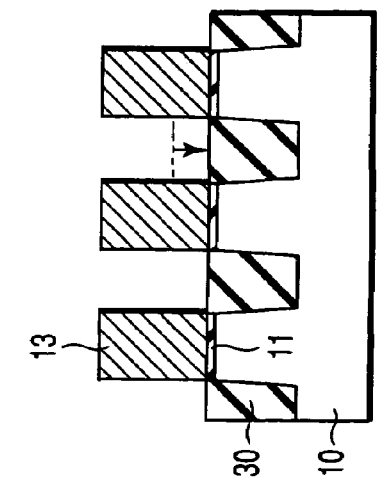

Next, as shown in FIGS. 6A–6C, the second insulating film 12 is etched away by means of RIE using the gate masking pattern 31 as a mask. At the same time, the device isolation insulating film 30 in the memory cell area is etched until its top reaches the same level as the first insulating film 11. At this point, the device isolation insulating film 30 in the peripheral circuit area also undergoes etching with the result that its step height with respect to the first insulating film 11 is reduced.

Next, as shown in FIGS. 7A–7C, the floating gate electrode layer 13 is etched by RIE using the gate masking pattern 31 as a mask under etching conditions of sufficient selectivity thereof to the gate insulating film (the first insulating film) 11 to form stacked gate structure in which the floating gate electrode 13 and the control gate electrode 14 are stacked. In this stage, a two-layer gate structure which is the same as that as shown in FIG. 3D is left below the word line in the direction of gate width in the memory cell area.

In etching the floating gate electrode layer 13, the step height of the device isolation insulating film 30 in the peripheral circuit area has been reduced as shown in FIG. 6C. When the floating gate layer 13 of transistors in the peripheral circuit area is etched, therefore, it becomes difficult for a portion of the floating gate material to be left unetched on the sidewall of the device isolation insulating film 30.

After that, using standard manufacturing processes, the source/drain regions of the cell transistors and the peripheral transistors are formed, then a gate oxide film is formed on the surface of the active regions by thermal oxidation, a capping material is coated onto the stacked gates, and an interlayer insulating film is formed over the entire surface of the substrate. Contact holes are formed in predetermined portions of the interlayer insulating film and then interconnect lines are formed that connect to predetermined portions of the source/drain regions through the contact holes.

In the above manufacturing process, in forming stacked gates by etching the floating gate layer 13 and the control gate layer 14 in the memory cell area and the peripheral circuit area to self-align to the device isolation regions, after the control gate layer 14 is removed until the second insulating film 12 between the control and floating gates is exposed, the device isolation insulating film 30 is also etched to a desired height at the same time the second insulating film 12 is removed. Thereby, the height of the device isolation insulating film 30 (the distance between the surface of that insulating film and the surface of active regions in the substrate 10) between stacked gates can be reduced.

During etching of the device isolation insulating film 30, the first insulating film 11 in the memory cell area, formed on the surface of the substrate 10, on which no electrode layer is present is not removed. Also, the substrate region underlying the electrode layer in the memory cell area is protected by the lower gate layer (polysilicon) 13 acting as floating gates.

Therefore, the substrate surface will not be directly struck with ions during RIE. The substrate will not have impurities introduced into it or will not be damaged. The substrate surface level will not be lowered.

The NAND type flash memory having the gate structures shown in FIGS. 7A–7C is summarized as including trench type device isolation regions formed in a semiconductor substrate, semiconductor active regions electrically isolated by the device isolation regions, and a first electrode layer self-aligned to the device isolation regions. The top of the device isolation regions is located at a first level above the top of the semiconductor substrate in an area in which there is a second electrode layer at a level above the first electrode layer and located at a second level which is below the first level but above the top of the semiconductor substrate in an area in which the second electrode layer is not present (the device isolation regions between adjacent gates). The top of the semiconductor active regions is located at substantially the same level in both the area in which there is the second electrode layer and the area in which there is no second electrode layer.

Figure 24:
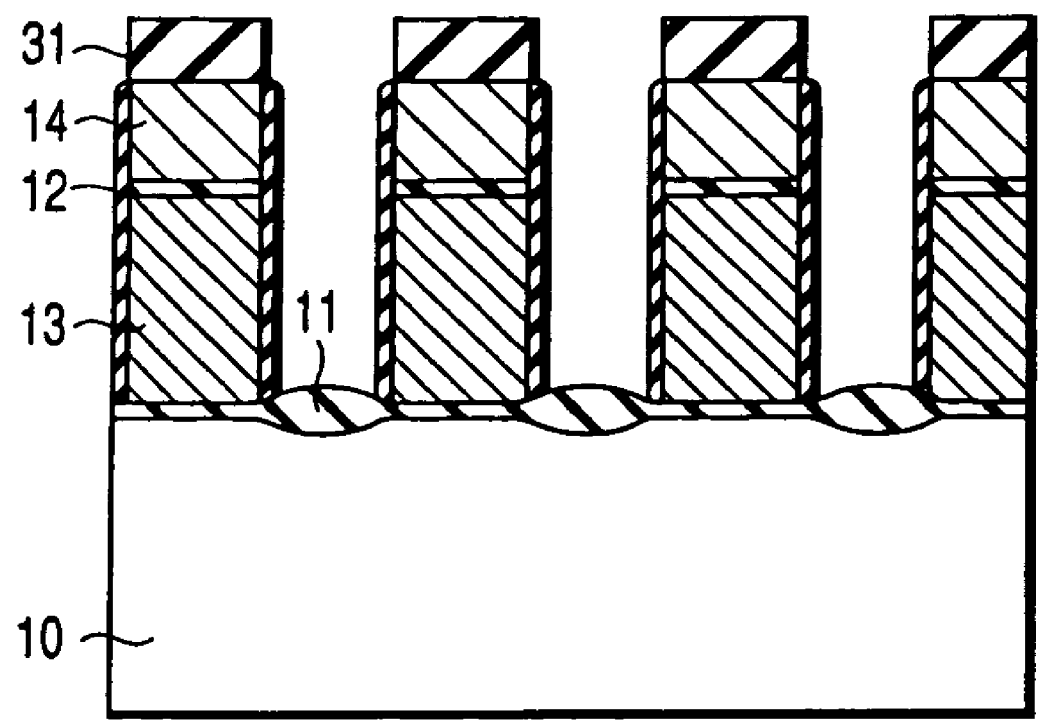
FIG. 24 is a sectional view taken substantially along line B—B of FIG. 1 after processing the first electrode layer.

Strictly speaking, as shown in FIG. 24, in the area in which the second electrode layer exists the top of the semiconductor active regions is at a lower level than in the area in which no second electrode layer exists by the amount corresponding to the thickness of a thermal oxide film formed after the processing of the first electrode layer.

[Modification of the Manufacturing Process of the First Embodiment]

In etching away the second insulating film 12 by means of RIE using the gate masking pattern 31 as a mask as shown in FIGS. 6A–6C, a portion of the second insulating film may be left unetched on the side of the floating gate layer 13. In this case, when etching the floating gate layer 13 by RIE using the gate masking pattern 31 as a mask under etching conditions of sufficient selectivity to the gate insulating film (first insulating film) 11 in the process of FIGS. 7A–7C, a portion of the second insulating film may be left unetched in the form of a pillar. In that case, a problem will be encountered in forming a contact in the place where the second insulating layer 12 is left unchanged. A modification of the manufacturing process that circumvents this problem will be described below.

First, as in the process shown in FIGS. 3A–3C and FIGS. 4A–4C, the first insulating film 11, the floating gate electrodes 13 and the device isolation insulating film 30 are formed on the semiconductor substrate (Si substrate) 10. Next, the upper portions of the device isolation regions 30 in the memory cell area are removed until their top is located at a level below the top of the floating gate electrodes 13.

After that, the second insulating film 12 is formed over the entire surface of the substrate and a portion of the second insulating film 12 over the device region in the peripheral circuit area is removed to expose a portion of the floating gate electrode 13. Next, the control gate electrode layer 14 is formed over the entire surface of the substrate and then the gate masking layer is deposited and patterned to form the gate masking pattern 31.

Figure 8C:
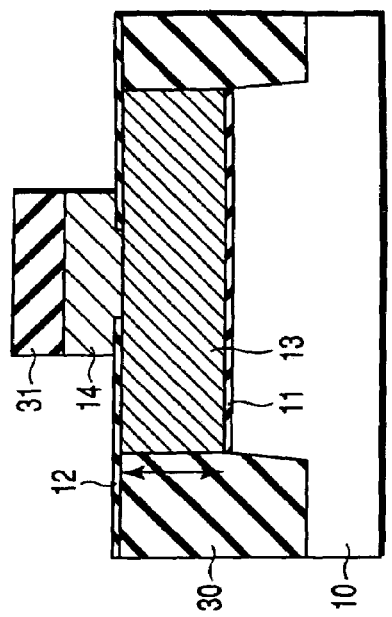
FIGS. 8A, 8B and 8C are sectional views of the flash memory after the stage of FIGS. 4A–4C in accordance with another manufacturing method.
Figure 8B:
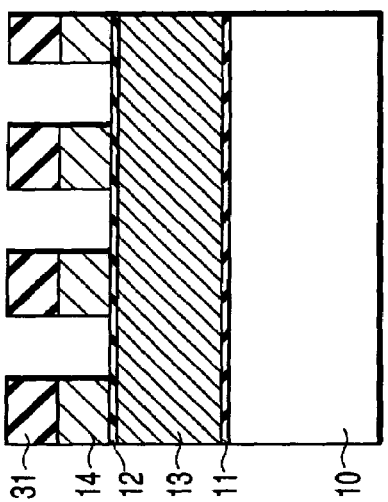
Figure 8A:
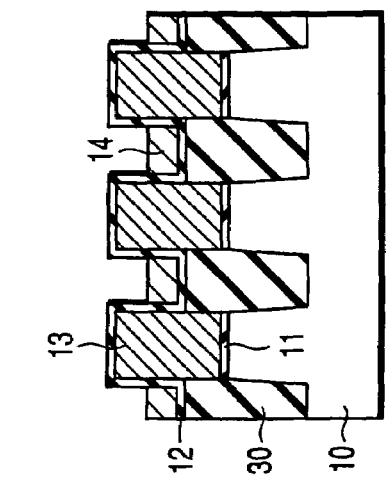

Next, as shown in FIGS. 8A–8C, the control gate layer 14 is etched by RIE using the gate masking pattern 31 as a mask. At this point, the etch process is controlled so that some of the control gate layer 14 is left on the device isolation regions 30.

Next, as shown in FIGS. 9A–9C, the second insulating layer 12 is etched away by RIE using the gate masking pattern 31 as a mask. At this point, the device isolation insulating film 30 in the peripheral circuit area is also etched, lowering its height with respect to the first insulating film 11.

Next, as shown in FIGS. 10A–10C, the control gate layer 14 and the floating gate layer 13 are etched by RIE using the gate masking pattern 31 as a mask under etching conditions of high selectivity to the second insulating film 12 and the gate insulating film (first insulating film) 11. Thereby, a stacked gate structure is obtained in which the floating gate electrode 13 of one-layer structure and the control gate electrode 14 are stacked. In this stage, a two-layer gate structure which is the same as that as shown in FIG. 3D is left below the word line in the direction of gate width in the memory cell area.

In etching the control gate layer 14 and the floating gate electrode layer 13, the step height of the device isolation insulating film 30 in the peripheral circuit area has been reduced by the process of FIGS. 9A–9C. In etching the floating gate layer 13 of transistors in the peripheral circuit area, therefore, it becomes difficult for a portion of the floating gate material to be left unetched on the sidewall of the device isolation insulating film 30.

Next, as shown in FIGS. 11A–11C, the second insulating film 12 on the device isolation regions 30 in the memory cell area and the first insulating film 11 on the substrate surface in the memory cell area are etched away and the device isolation regions 30 in the memory cell area are then etched so that their top is at substantially the same level as the substrate surface.

According to the manufacturing process shown in FIGS. 3A–3C, FIGS. 4A–4C and FIGS. 8A–8C through 11A–11C, the aforementioned problem that a portion of the second insulating film 12 is left unetched in the form of a pillar can be circumvented.

[Second Embodiment]

In the modification of the first embodiment, in etching the device isolation regions 30 so that their top is at substantially the same level as the substrate surface as shown in FIGS. 11A–11C, a problem arises in that the top of the semiconductor substrate 10 is not protected by the first insulating film 11. A manufacturing process that circumvents that problem will be described as a second embodiment of the present invention.

First, as in the process shown in FIGS. 3A–3C and FIGS. 4A–4C, the first insulating film 11, the floating gate electrodes 13 and the device isolation insulating film 30 are formed on the semiconductor substrate (Si substrate) 10. Next, the upper portions of the device isolation regions 30 in the memory cell area are removed until their top is located at a level below the top of the floating gate electrodes 13. After that, the second insulating film 12 is formed over the entire surface of the substrate and a portion of the second insulating film 12 over the device regions in the peripheral circuit area is removed to form an opening that exposes a portion of the floating gate electrode 13. Next, the control gate electrode layer 14 is formed over the entire surface of the substrate and then the gate masking layer is deposited and patterned to form the gate masking pattern 31.

Next, as shown in FIGS. 8A–8C, the control gate layer 14 is etched by RIE using the gate masking pattern 31 as a mask. At this point, the etch step is controlled so that some of the control gate layer 14 is left on the device isolation regions 30.

Next, as shown in FIGS. 9A–9C, the second insulating layer 12 is etched away by RIE using the gate masking pattern 31 as a mask. At this point, the device isolation insulating film 30 in the peripheral circuit area is also etched so that its top is located at a level midway between the floating gate layer 13 and the first insulating film 11, lowering its height with respect to the first insulating film 11.

Next, as shown in FIGS. 12A–12C, the floating gate layer 13 is etched by RIE using the gate masking pattern 31 as a mask under etching conditions of high selectivity to the second insulating film 12. At this point, the etching of the floating gate layer 13 is stopped when its surface reaches a level lower than the surface of the second insulating film 12 on the device isolation insulating film 30 in the memory cell area (that is, a level a little lower than the surface of the device isolation insulating film 30 in the peripheral circuit area).

Next, as shown in FIGS. 13A–13C, the second insulating film 12 on the device isolation insulating film 30 in the memory cell area is etched away and the device isolation insulating film 30 in the memory cell area is etched until its surface comes to the same level as the surface of the first insulating film 11. In the peripheral circuit area, the device isolation insulating film 30 is etched until its surface comes to a level a little lower than the surface of the floating gate electrode 13. During this etching process, the top surface of the semiconductor substrate 10 is protected by the floating gate layer 13 and the first insulating film 11.

Next, as shown in FIGS. 14A–14C, the floating gate layer 13 is etched by means of RIE using the gate masking pattern 31 as a mask under etching conditions of high selectivity to the first insulating film 11. Thereby, a stacked gate structure is obtained in which the floating gate electrode 13 of one-layer structure and the control gate electrode 14 are stacked. In this stage, a two-layer gate structure which is the same as that as shown in FIG. 3D is left below each of the word lines in the direction of gate width in the memory cell area.

After that, through standard manufacturing processes, the source/drain regions of the cell transistors and the peripheral transistors are formed, then a gate oxide film is formed on the surface of the active regions by thermal oxidation, a capping material is coated onto the stacked gates, and an interlayer insulating film is formed over the entire surface of the substrate. Contact holes are formed in predetermined portions of the interlayer insulating film and then interconnect lines are formed that connect to predetermined portions of the source/drain regions through the contact holes.

According to the manufacturing process shown in FIGS. 3A–3C, FIGS. 4A–4C, FIGS. 9A–9C and FIGS. 12A–12C through FIGS. 14A–14C, the step height of the device isolation insulating film 30 in the peripheral circuit area has been reduced when the floating gate electrode layer 13 of the transistors in the peripheral circuit area is etched. Therefore, it becomes difficult for a portion of the floating gate material to be left unetched on the sidewall of the device isolation insulating film 30. Also, as shown in FIGS. 14A–14C, in etching the floating gate layer 13 by means of RIE under etching conditions of high selectivity to the first insulating film 11, the top of the semiconductor substrate in portions of the memory cell area in which no electrode layer is present is protected by the first insulating film 11. The substrate regions underlying the electrode layers in the memory cell area are protected by the lowermost layer of polysilicon acting as the floating gate electrodes 13. Therefore, the substrate surface will not be directly struck with ions during RIE. The substrate will not have impurities introduced into it or will not be damaged. The substrate surface level will not be lowered.

[Third Embodiment]

Although the first and second embodiments have been described as using the floating gate electrode layer of one-layer structure, the third embodiment uses a floating gate electrode layer of two-layer structure.

Figure 15C:
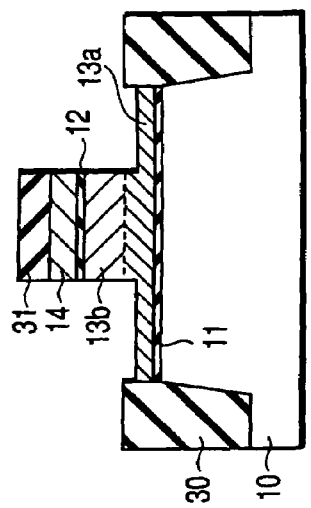
FIG. 15C is a sectional view in the direction of gate length of a peripheral transistor of the flash memory at the same stage as in FIG. 15A.
Figure 15B:
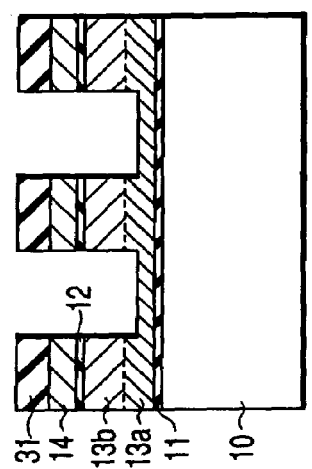
FIG. 15B is a sectional view in the direction of gate length of the memory cell area at the same stage as in FIG. 15A.
Figure 15A:
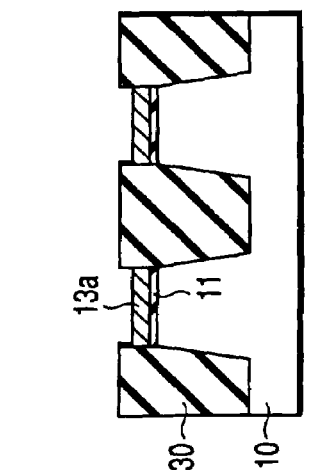
FIG. 15A is a sectional view in the direction of gate width of the memory cell area of a flash memory according to a second embodiment of the present invention at a stage of manufacture of thereof.
Figure 16C:
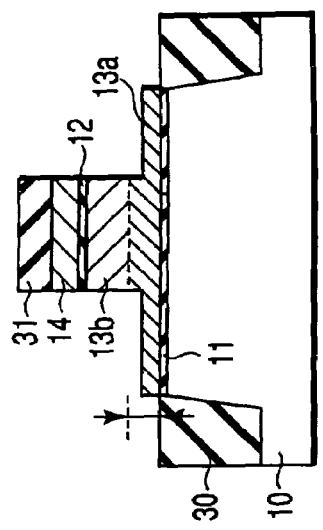
FIGS. 16A, 16B and 16C are sectional views of the flash memory which correspond to FIGS. 15A, 15B and 15C, respectively, after the step of etching the gate mask material subsequent to the stage of FIGS. 15A–15C.
Figure 16B:
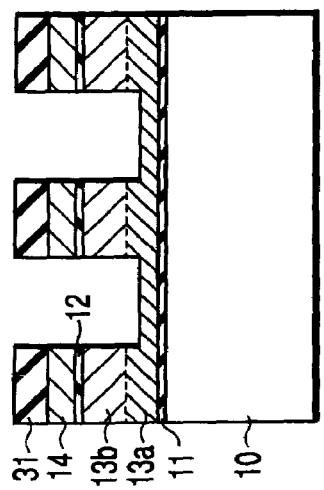
Figure 16A:
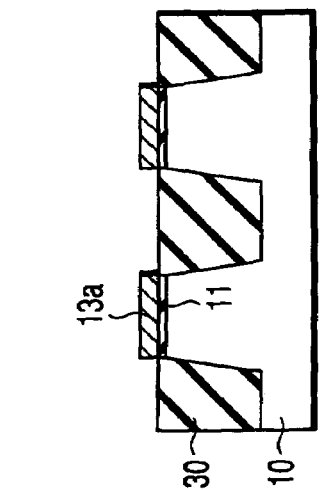
Figure 17C:
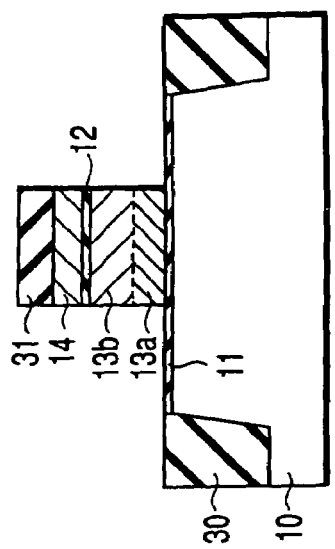
FIGS. 17A, 17B and 17C are sectional views of the flash memory which correspond to FIGS. 15A, 15B and 15C, respectively, after the step of etching the control gates subsequent to the stage of FIGS. 16A–16C.
Figure 17B:
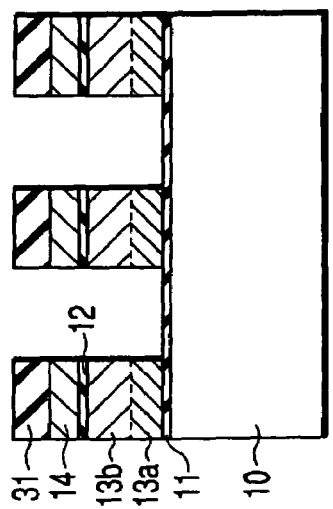
Figure 17A:
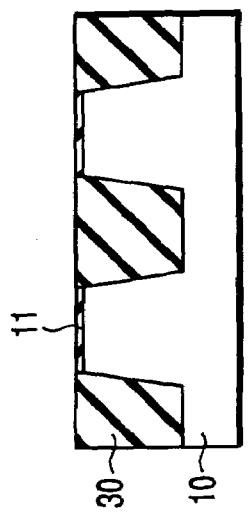

FIGS. 15A–15C through FIGS. 17A–17C illustrate sectional structures of portions of the memory cell area and a transistor of the peripheral circuit area in a NAND type flash memory according to the third embodiment of the present invention at stages of manufacture thereof. FIGS. 15A, 16A and 17A are sectional views, in the order of steps of manufacture, of the memory cell area taken along line A—A of FIG. 1 in the direction of gate width (the direction of word line). FIGS. 15B, 16B and 17B are sectional views, in the order of steps of manufacture, of the memory cell area taken along line B—B of FIG. 1 in the direction of gate length. FIGS. 15C, 16C and 17C are sectional views, in the order of steps of manufacture, of the peripheral circuit area taken along line C—C of FIG. 1 in the direction of gate length.

In the third embodiment, the processes described with reference to FIGS. 18A–18C through FIGS. 21A–21C are followed by the processes shown in FIGS. 15A–15C through FIGS. 17A–17C.

Figure 18C:
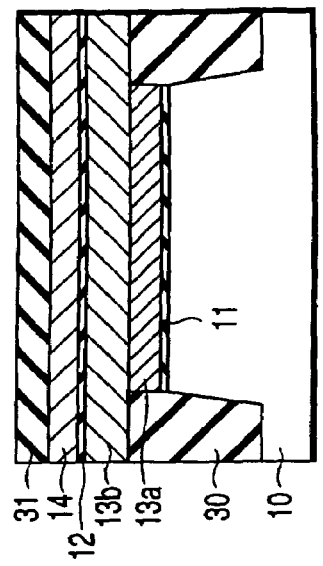
FIG. 18C is a sectional view in the direction of gate length of a peripheral transistor of the conventional flash memory at the same stage as in FIG. 18A.
Figure 18B:
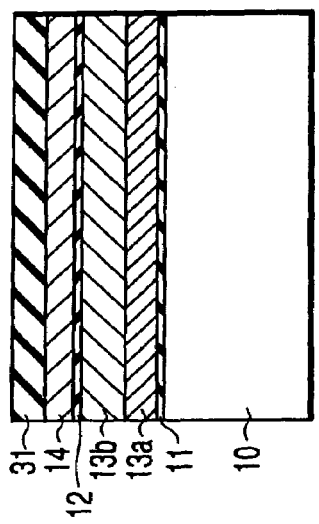
FIG. 18B is a sectional view in the direction of gate length of the memory cell area of the conventional flash memory at the same stage as in FIG. 18A.
Figure 18A:
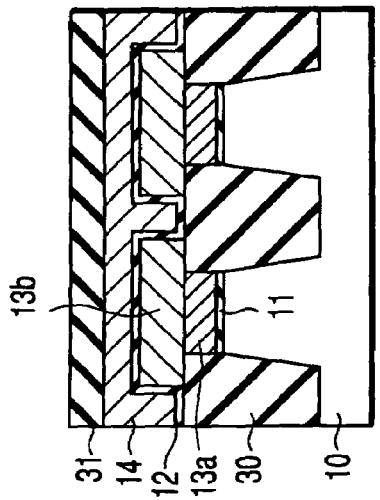
FIG. 18A is a sectional view in the direction of gate width of the memory cell area of a conventional flash memory at a stage of manufacture of thereof.
Figure 19C:
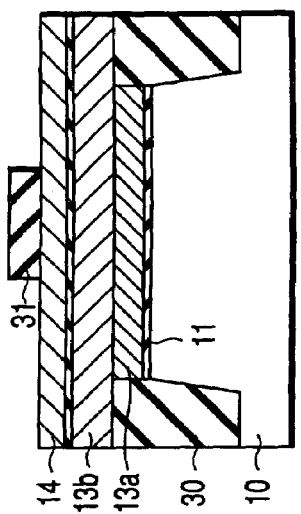
FIGS. 19A, 19B and 19C are sectional views of the conventional flash memory after the step of etching the gate mask material subsequent to the stage of FIGS. 18A–18C.
Figure 19B:
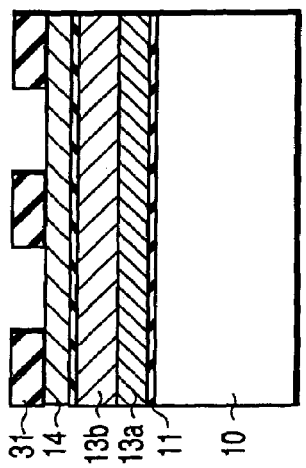
Figure 19A:
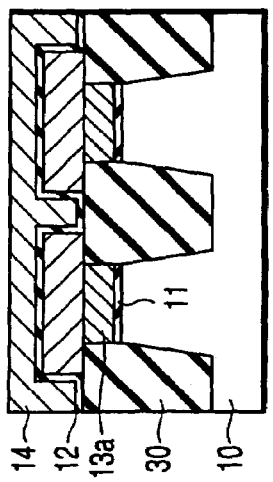
Figure 20C:
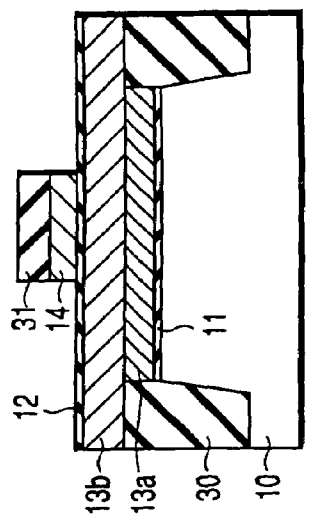
FIGS. 20A, 20B and 20C are sectional views of the conventional flash memory after the step of etching the control gates subsequent to the stage of FIGS. 19A–19C.
Figure 20B:
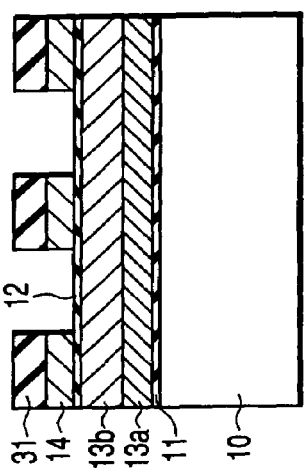
Figure 20A:
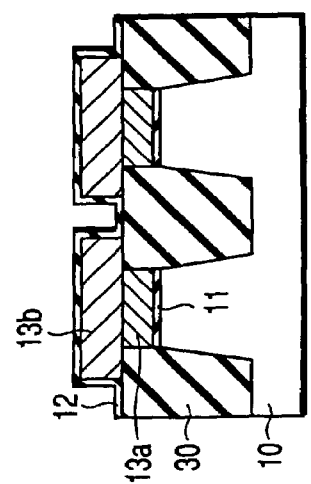
Figure 21C:
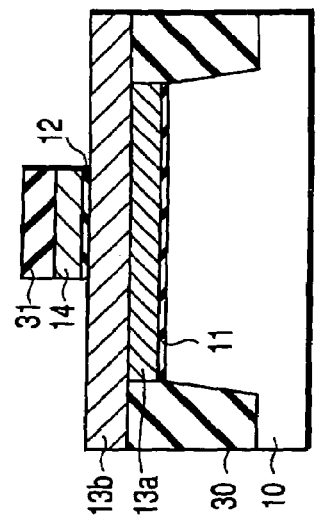
FIGS. 21A, 21B and 21C are sectional views of the conventional flash memory and illustrate a step subsequent to the step of FIGS. 20A–20C.
Figure 21B:
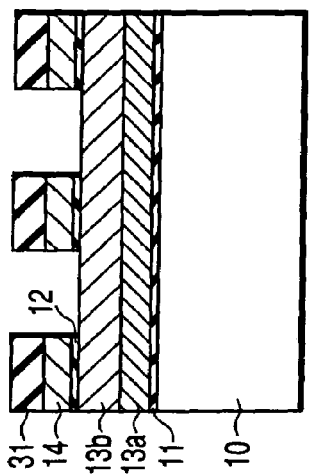
Figure 21A:
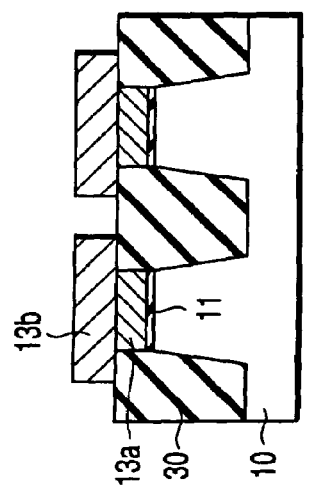
Figure 23:
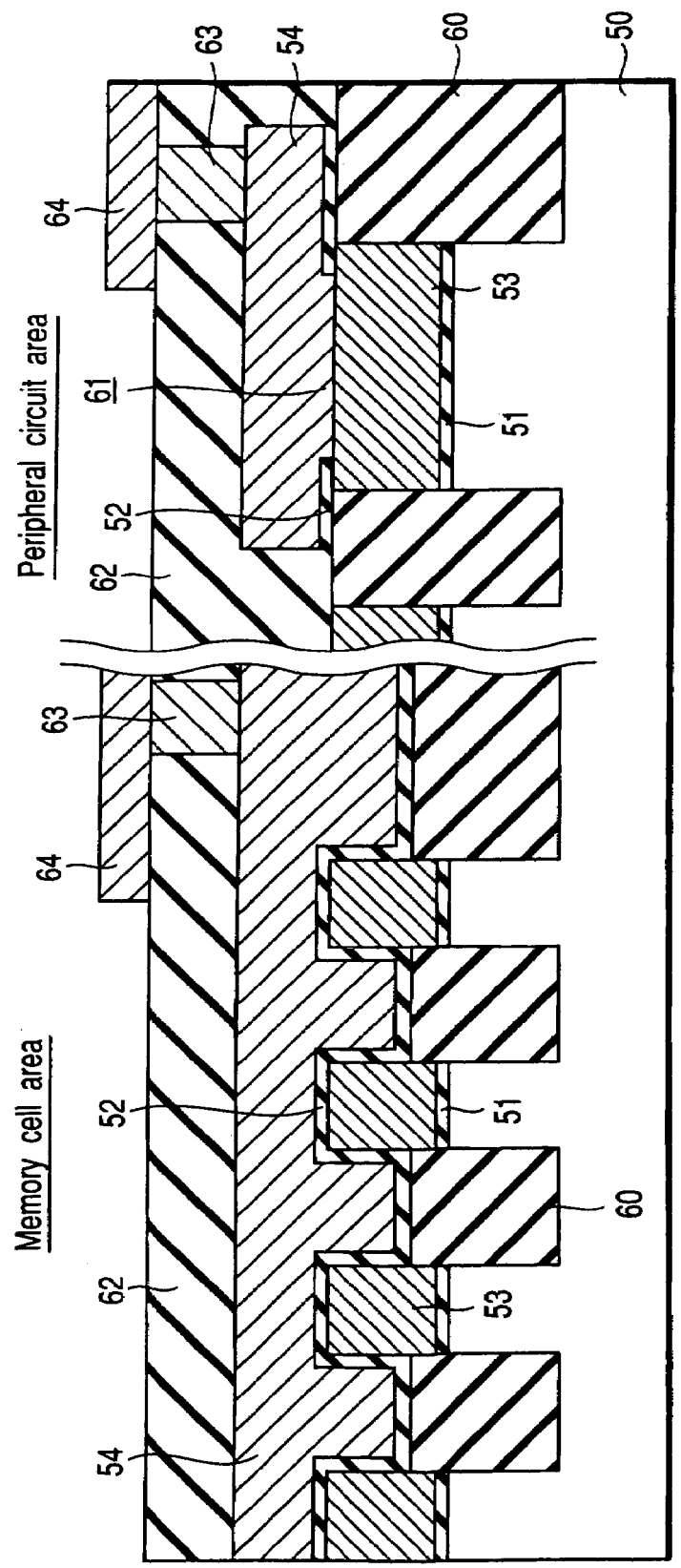
FIG. 23 is a sectional view illustrating the memory cell area and the peripheral circuit area of a semiconductor device which has been proposed.

First, as shown in FIGS. 18A–18C, the first insulating film 11, the first (lower) floating gate layer 13a, the device isolation regions 30, the second (upper) floating gate layer 13b, the second insulating film 12, the control gate layer 14 and the gate masking material layer 31 are formed. Next, as shown in FIGS. 19A–19C, the gate masking pattern 31 is formed. Next, as shown in FIGS. 20A–20C, the control gate layer 14 is etched. Next, as shown in FIGS. 21A–21C, the second insulating film 12 is etched.

Next, as shown in FIGS. 15A–15C, the second floating gate layer 13b and the first floating gate layer 13a are etched using the gate masking pattern 31 as a mask. In this case, although the second floating gate layer 13b is etched thoroughly, the first floating gate layer 13a is etched until its top reaches a level midway between the top of the device isolation region 30 and the surface of the first insulating film 11. In this state, the top of the device isolation regions is located at a level above the Si substrate surface (active region surface). A low step is formed between the top of the device isolation region 30 and the top of the remainder of the first floating gate layer 13a.

Next, as shown in FIGS. 16A–16C, the device isolation regions 30 are etched until its top reaches the same level as the first insulating film 11.

Next, as shown in FIGS. 17A–17C, the remainder of the first floating gate layer 13a is etched away by means of RIE using the gate masking pattern 31 as a mask. Thereby, a stacked gate structure is obtained in which the floating gate electrode of two-layer structure and the control gate electrode are stacked. In this stage, a two-layer gate structure which is the same as that as shown in FIG. 3D is left below the word lines in the direction of gate width in the memory cell area.

Thereafter, the same processes as in the first embodiment are performed to finish the semiconductor device.

The third embodiment also will provide substantially the same advantages as the first embodiment from substantially the same reasons.

According to the present invention, as described above, a semiconductor device and a method of manufacture thereof are provided which can keep a portion of the lower gate material from being left unetched on the sidewall of the device isolation insulating film and therefore prevent gate electrodes from being short-circuited by reducing the distance between the top of the trench type device isolation insulating film, formed to self-align to at least the lower gate of stacked gates, and the surface of the semiconductor substrate prior to the step of etching away the lower gate.

In addition, a semiconductor device in which transistors in the memory cell area and the peripheral circuit area have a stacked gate structure and a method of manufacture thereof are provided which, in etching away the floating gates of the memory cell and peripheral transistors, can keep a portion of the lower gate material from being left unetched on the sidewall of the device isolation insulating film and therefore prevent gate electrodes from being short-circuited.

What is claimed is:

1. A semiconductor device comprising:
   a semiconductor substrate including a plurality of trench type isolation regions and a plurality of semiconductor active regions alternately located with each other;
   a plurality of first electrode layers, each first electrode layer formed over the isolation regions and the active regions, the adjacent first electrode layers formed with predetermined interval; and
   a plurality of second electrode layers located between the active regions and the first electrode layers,
   a first upper surface of the isolation regions facing the first electrode layers protruding from a second upper surface of the semiconductor substrate and a height of the first upper surface being lower than a height of a third upper surface of the second electrode layers, a height of a fourth upper surface of the isolation regions located between the first electrode layers being lower than the height of the first upper surface, and a height of a fifth upper surface of the active regions located under the second electrode layers being substantially the same as a height of a sixth upper surface of the active regions located between the first electrode layers, relative to the second upper surface.

2. The semiconductor device according to claim 1, wherein the first electrode layers include a control gate and the second electrode layers include a floating gate.

3. The semiconductor device according to claim 1, further comprising a first insulating film formed between the active regions and the second electrode layers.

4. The semiconductor device according to claim 1, further comprising a second insulating film formed under the first electrode layers.

5. The semiconductor device according to claim 4, wherein the first and the third upper surfaces are located under the second insulating film.

6. A semiconductor device comprising:
   a semiconductor substrate including a first upper surface having a plurality of isolation regions and a plurality of semiconductor active regions alternately located with each other;

a plurality of first electrode layers, each first electrode layer formed over the isolation regions and the active regions, the adjacent first electrode layers formed with predetermined interval, the isolation regions including a second upper surface facing to the first electrode layer and a third upper surface located between the first electrode layers, and the active region including a fourth upper surface located under the first electrode layer and a fifth upper surface located between the first electrode layers; and a plurality of second electrode layers located between the active regions and the first electrode layers, having a sixth upper surface, the second upper surface protruding from the first upper surface and a height of the second upper surface being lower than a height of the sixth upper surface, a height of the third upper surface being lower than the height of the second upper surface and a height of the fourth upper surface being substantially the same as a height of the fifth upper surface, relative to the first upper surface.

7. The semiconductor device according to claim 6, wherein the first electrode layers include a control gate and the second electrode layers include a floating gate.

8. The semiconductor device according to claim 6, further comprising a first insulating film located between the active regions and the second electrode layers.

9. The semiconductor device according to claim 6, further comprising a second insulating film formed under the first electrode layers.

10. The semiconductor device according to claim 9, wherein the second and the fourth upper surfaces are located under the second insulating film.

* * * * *